United States Patent
Shepston et al.

(12)

(10) Patent No.: US 6,469,558 B1
(45) Date of Patent: Oct. 22, 2002

(54) ELECTRICALLY ADJUSTABLE PULSE DELAY CIRCUIT

(75) Inventors: Shad R. Shepston, Firestone, CO (US); M. Jason Welch, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/558,460

(22) Filed: Apr. 25, 2000

(51) Int. Cl.[7] .............................................. H03H 11/26
(52) U.S. Cl. ...................................... 327/278; 327/264
(58) Field of Search ................................ 327/278, 264, 327/270, 272, 268, 161, 344, 291, 111, 170

(56) References Cited

U.S. PATENT DOCUMENTS

| | | | | |
|---|---|---|---|---|
| 4,829,199 A | * | 5/1989 | Prater | 326/27 |
| 5,140,194 A | * | 8/1992 | Oritaka | 326/86 |
| 5,241,221 A | * | 8/1993 | Fletcher et al. | 327/170 |
| 5,371,420 A | * | 12/1994 | Nakao | 327/111 |
| 5,734,286 A | * | 3/1998 | Takeyama et al. | 327/291 |
| 6,219,195 B1 | * | 4/2001 | Jusuf et al. | 360/67 |

\* cited by examiner

Primary Examiner—Timothy P. Callahan
Assistant Examiner—Linh Nguyen
(74) Attorney, Agent, or Firm—Edward L. Miller

(57) ABSTRACT

A voltage ramp/threshold variable pulse delay circuit implemented on an IC varies the R instead of the C, which may be fixed. A variable R is formed by a plurality of FET's arranged in parallel. The FET's are sized according to a weighting scheme, which may be binary, and the amount of R produced is determined by which combination of FET's is switched ON, rather than by analog variations in their drive level. If the plurality of sized parallel FET's is made up of individual FET's all of the same polarity, then an undesirable reduction in voltage comparison range will obtain, which may produce an objectionable reduction in available pulse delay if VDD is reduced such that it is no longer many times larger than FET threshold voltage. That reduction in voltage comparison range can be eliminated by replacing each such individual FET with a pair of similarly sized FET's in parallel, the members of which pair are of opposite polarities. The additional FET's have their own drive signals that correspond to the original drive signals.

9 Claims, 2 Drawing Sheets

ELECTRICALLY ADJUSTABLE PULSE DELAY CIRCUIT

BACKGROUND OF THE INVENTION

There is often a need to delay a pulse by some variable amount and in response to an electrical delay control signal which, perhaps, has been derived from a control loop of some kind. For example, there are memory system definitions where data read from a memory and an associated strobe signal, intended to instruct a receiving circuit to latch that data, are all generated with simultaneous leading edges. In such systems it is generally desirable to delay the strobe signal by a quarter cycle of the data transmission rate. This allows the data to settle and minor variations in arrival time for the various signals to be ignored. Various pulse delay circuits have been developed to perform this task. In a complex system such things as temperature change, power supply drift or shifts in other environmental variables can cause change either in the underlying data rate or in the amount of the delay circuit's actual pulse delay produced by application of a given amount of delay control signal. (That is, the amount of delay needed or the amount provided, or both, might change.) In such complex systems it is common to cascade four generally identical adjustable delay elements connected to a common delay control signal, and then compare an undelayed instance of suitable clock signal with its fully delayed version using a coincidence detector, whose output servos the delay control signal. After some initial training this arrangement forms a control loop maintaining a one cycle delay produced by cascading four quarter cycle delays. The frequency of the clock signal is presumably also the underlying maximum repetition rate of the strobe signal. A delayed strobe signal having quarter cycle delay can then be obtained by applying the undelayed strobe signal to a separate fifth delay element controlled by the same common delay control signal. This arrangement has the advantage that the strobe is delayed by the right amount without requiring that it be synchronous with any other particular edge in the system.

It is conventional for the general nature of the delay element to be that of a voltage ramp compared to a comparison threshold. That is, an arriving edge is used to source or sink charge through a series RC (Resistance Capacitance) network formed of an input R and a grounded C. This forms at the junction of the R and C a voltage ramp whose output is applied to a subsequent switching element (typically a FET (Field Effect Transistor)) whose (fixed) switch point is the comparison threshold. The time constant of the RC network determines how much delay transpires before an applied arriving edge is replicated at the output. Prior art circuits have varied the RC time constant by switching in or out various amounts of component C that are in parallel when switched in and absent when switched out. The R is simply an appropriately sized FET. This works, but a disadvantage is that such capacitors consume valuable space within an IC (Integrated Circuit).

Furthermore, today's low power IC's often operate at low supply voltages, say at 2.5 to 3.5 volts. The FET threshold voltage (which is generally in the range of 0.5 to 0.7 volts) is a substantial fraction of that low supply voltage. Ordinarily, the maximum effective range of the ramp is the power supply voltage diminished by the threshold voltage. Threshold voltage is a function of how the FET's are fabricated, and does not scale down as supply voltage is lowered to reduce power consumption. This limits the operating range of voltage ramps (the comparison threshold cannot be set within a FET threshold voltage of the supply voltage VDD), and reduces the range of delay that can be produced.

SUMMARY OF THE INVENTION

A solution to the problem of providing variable pulse delay in a voltage ramp/threshold circuit implemented on and IC is to vary the R instead of the C, which may be fixed. A variable R is formed by a plurality of FET's arranged in parallel. The FET's are sized according to a weighting scheme, which may be binary, and the amount of R produced is determined by which combination of FET's is switched ON, rather than by analog variations in their drive level. If the plurality of sized parallel FET's is made up of individual FET's all of the same polarity, then the reduction in comparison range mentioned above will continue to obtain. That reduction in comparison range can be eliminated by replacing each such individual FET with a pair of similarly sized FET's in parallel, the members of which pair are of opposite polarities. The additional FET's have their own drive signals that correspond to the original drive signals.

DESCRIPTION OF A PREFERRED EMBODIMENT

Figure 1:
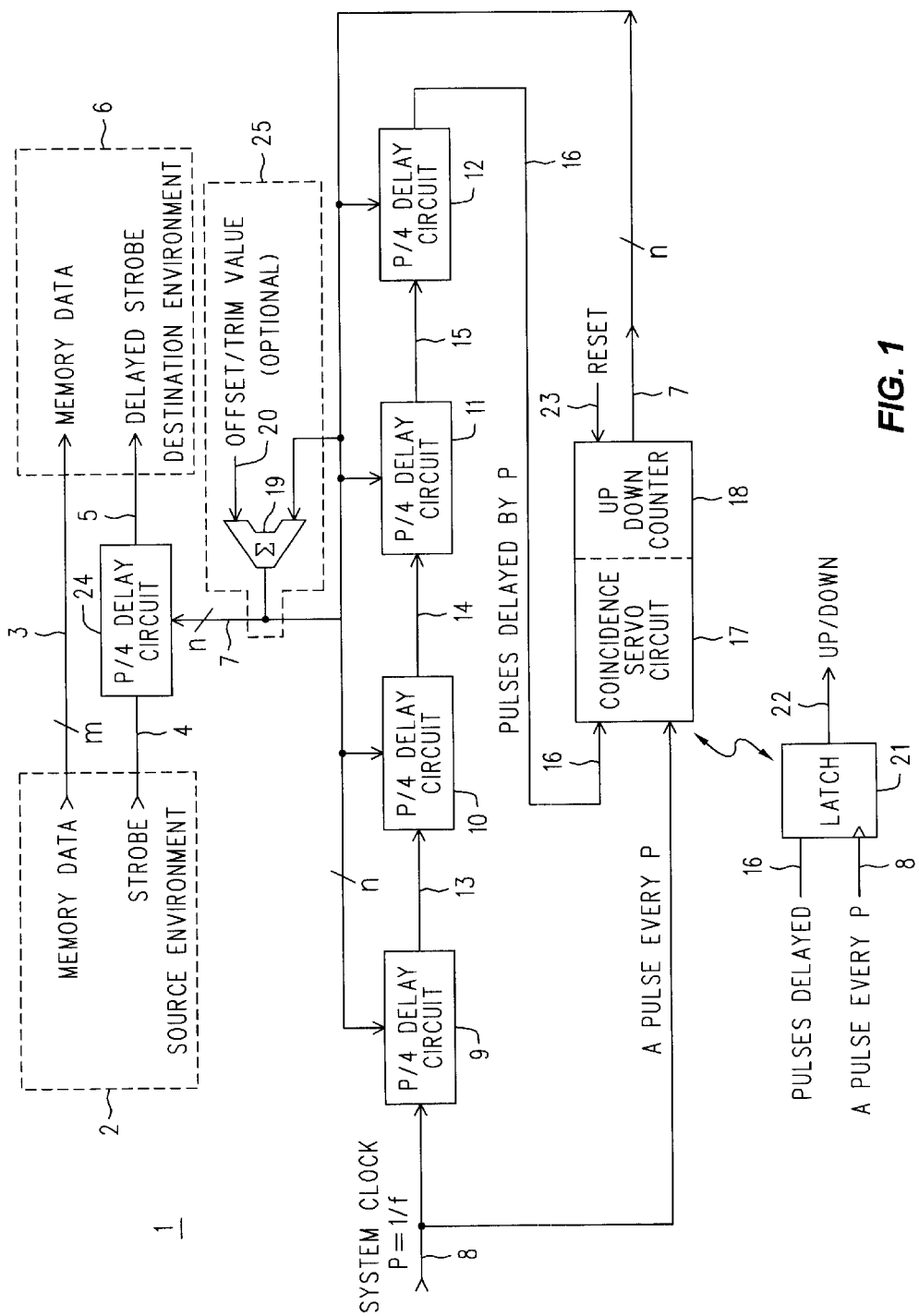
FIG. 1 is a simplified block diagram of a servoed delay circuit suitable for producing a quarter cycle delay in an arbitrarily occurring signal, such as a strobe for data read from a memory subsystem.

Refer now to FIG. 1, wherein is shown a simplified block diagram representation of a pulse delay circuit 1 that may be used in connection with a memory controller to provide a quarter period delay in a strobe signal. For example, there is shown such an example in the figure, where, in a Source Environment 2, memory data 3 of m-many bits in width and an associated strobe 4 are generated with simultaneous leading edges. The memory data 3 will used in a Destination Environment 6, but the timing of that use is determined by the strobe signal 4. To allow proper set-up of the latching circuits and settling time for the signals, it is desirable to delay the strobe signal 4 with a delay circuit 24 to produce a delayed strobe 5. In principle, no one particular delay is the only delay that will work. However, for system considerations it is often convenient to choose a delay equal to one fourth of a minimal period between consecutive strobes, realizing that sometimes strobes will be absent (there was no memory cycle), and that the delay should remain at a fixed and unaltered value relative to the leading edge of the strobe, independent of when a strobe occurs. That is, variations in the phasing of a strobe signal must be tolerated. Likewise, changes in temperature, process parameters and aging can cause the underlying system clock rates to vary. That is, the amount of delay that used to be a quarter period may no longer be a satisfactory quarter period after such shifts or drift. Thus, it is often convenient to provide a servo circuit to maintain the quarter period delay in spite of such underlying changes.

Such a servo arrangement is also depicted in FIG. 1. A system clock signal 8, having a period P that is the reciprocal of the clock frequency f, is applied to a P/4 Delay Circuit 9, as well as to a Coincidence Servo Circuit 17. The P/4 Delay Circuit 9 is the first in a cascaded chain (9–12) of four such circuits. For convenience the P/4 Delay Circuits are all identical (not necessary in principle, but a whole lot simpler when true) and there are four of them (as opposed to, say, three or five).

The exact nature of the P/4 Delay Circuit will be described in connection with FIG. 2; for now it is sufficient to appreciate its properties at a block diagram level. Each has a pulse input and a pulse output. For now, we can assume that each such delay unit is non-inverting, although this is not a strict requirement. The amount of time by which the leading edge of the output is delayed behind the leading edge of the input is determined by an n-bit value of a delay control signal 7. Say n were four, then the delay could vary from minimum to maximum in sixteen steps.

To continue, if each of the P/4 Delay Circuits did indeed produce a delay of P/4 then the overall delay for the cascaded chain would be 4P/4 =P. Such a fully delayed version 16 of the applied system clock 8 is applied as another input to the Coincidence Servo Circuit 17, which determines if the leading of one signal precedes the other, or otherwise. The n-bit value of the delay control signal is adjusted in a sense that forms a negative feedback loop, where the order of the applied leading edges is the input value. As shown in the figure, the coincidence detector might be as simple as a latch 21, whose output is a signal UP/DOWN 22 that is subsequently applied to an Up Down Counter 18, from whence the n-bit delay control signal originates. (To be sure, this is a minimalist's circuit that hunts by one bit even when the delays are otherwise perfect. More elaborate control schemes are known, and we need not pursue them here.)

Now, the assumption is that the System Clock 8 is a signal that occurs at the maximum rate of the strobe to be delayed. The servo circuit described above provides an n-bit value that will produce a delay of P/4. But when a given instance of a P/4 delay is to start is strictly a function of when the leading edge of the strobe signal occurs. We cannot assume that, say, the second P/4 Delay Circuit 10 in the chain will produce a signal that could be used, through gating, as the source of the desired delayed strobe; in some systems there is simply no guaranteed phase relation between the strobe in the memory system's source environment and the system clock. To deal with this arbitrary occurrence in time of the strobe signal we avail ourselves of a separate (fifth) P/4 Delay Circuit 24 that is generally identical to the others. It is supplied with the same n-bit delay control value that is used by the servo circuit, so it too produces a delay of P/4, just as do the others. It, however, receives as its input the strobe signal to be delayed. The result is the desired delay of the strobe signal by P/4.

Now it may happen that it is desirable to trim the n-bit delay control value produced by the servo circuit. This may be accomplished by an optional Offset/Trim Value Circuit 25 shown in the dotted lines. It consists of an adder 19 to which is applied the n-bit control value from the servo and a (digital) offset or trim value 20. The output from the adder is an adjusted n-bit control value that may be applied to the P/4 Delay Circuit 25 in place of the original n-bit value 7.

There is a start-up issue concerning the servo circuit that we have not yet addressed. It may be desirable to equip the Up Down Counter 18 with a RESET signal 23 that is exerted at appropriate times, such as at power-up. The RESET signal 23 may set the counter 18 to a median value or to an extreme value, as appropriate. The overall system should also understand that a period of training will be required for the servo to converge on its final state.

Ideally, applied pulse width is not changed by the P/4 Delay Circuit (9–12, 24), although that condition requires that trailing edges be delayed by an amount equal to the leading edges. To be sure, this is readily approximated, but a high level of accuracy in this regard may be more of an aggravation to maintain than it is worth. Fortunately, high fidelity of pulse width is seldom, if ever, a major consideration in applications of the sort we are interested in: delay relative to the leading edge is what is of considerable interest, however.

Figure 2:
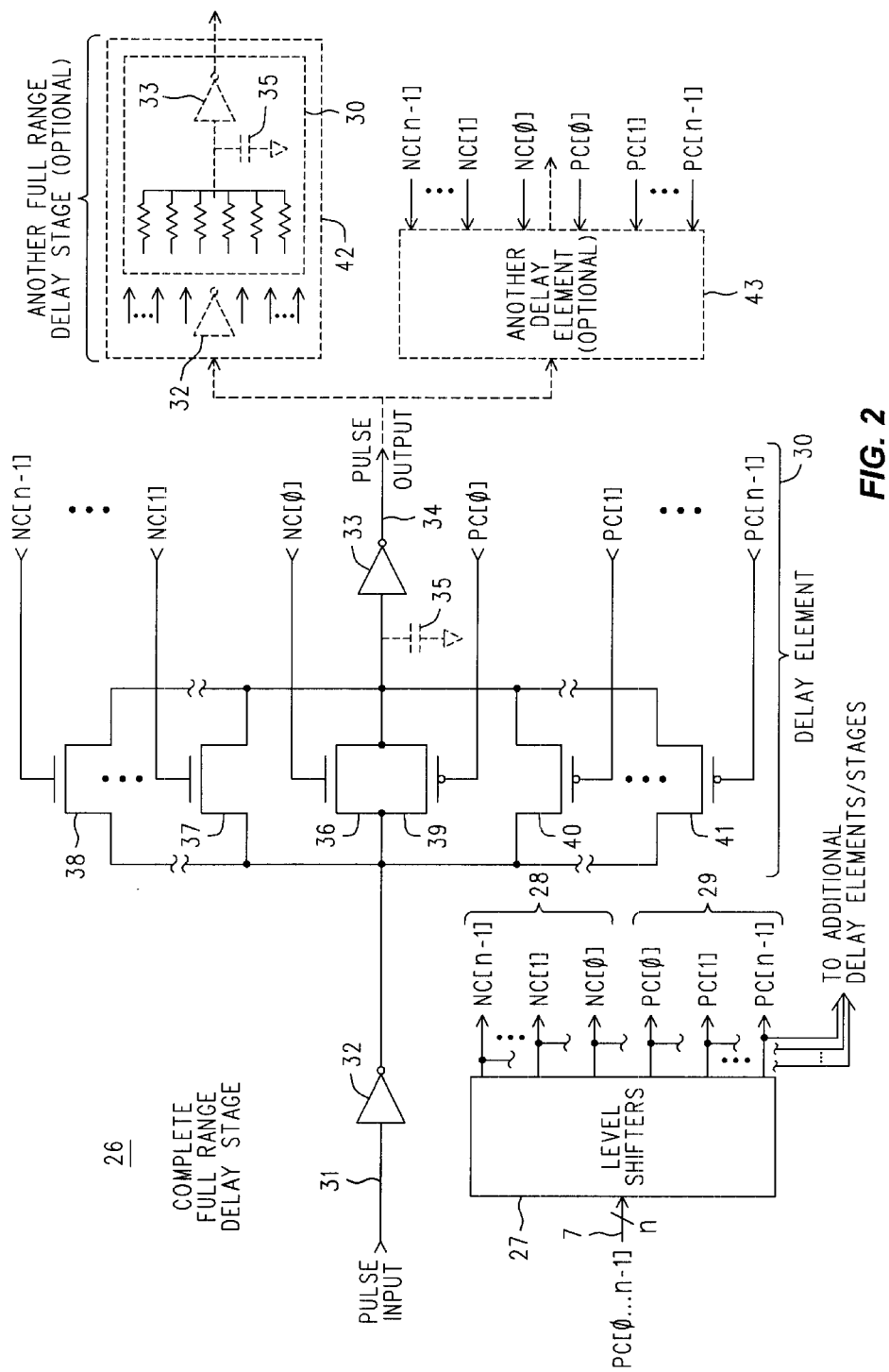
FIG. 2 is a simplified schematic diagram of an adjustable full range delay circuit suitable for use as a delay element in the block diagram of FIG. 1.

Refer now to FIG. 2, wherein is shown a simplified schematic of pulse delay circuitry that may be used in the production of the block diagram 1 of FIG. 1. In particular, note the Pulse Input 31 to input buffer 32, corresponding to the input 4 of P/4 Delay Circuit 24. Buffer 32 inverts the applied pulse, although such inversion is not a necessity. The output from input buffer 32 is applied through a network of paralleled pairs of FET's 36–41 of opposite polarities (N-FET's and P-FET's) to the input of an output buffer 33, whose output 34 is the delayed pulse output. Note also that the input of the output buffer 33 has an input capacitance 35. The various FET's 36–41 act as a resistance that forms, with capacitance 35 an RC circuit. In known fashion the voltage across the capacitor 35 rises or falls exponentially as the output of input buffer 32 experiences a step in voltage resulting from a leading or trailing edge. The voltage waveform across the capacitor is not linear unless the FET's act as constant current sources (which they don't really do), so it is, strictly speaking, stretching things a bit to call that waveform a ramp.

Still, it is at least ramp-like, and as such, has a definite delay after its onset before it reaches an internal threshold in output buffer 33. When that threshold is reached the output 34 of the output buffer 33 changes state. If both buffers 32 and 33 are inverting (the preferred case), then such a change in state represents the delayed replication at the Pulse Output 34 of an edge applied to the Pulse Input 31.

The amount of delay is determined by the RC time constant (of the FET's and the capacitor 35) and the threshold. We can expect the threshold to stay essentially fixed. But the time constant can be varied by controlling the number of FET's 36–41 that are turned on during any given period of time. The pairs of FET's (36/39, 37/40, . . . 38/41) are sized to allow certain of the pairs to exhibit a relative low resistance when on, while other pairs are sized to exhibit a relatively high resistance when on. These relative weightings may correspond to a binary code that determines which pairs are on. The members of a pair of FET's include one of each polarity. The signals that control which FET's are on arise from the n-bit delay value 7, which we may label as the signals C[0] through C[n−1]. These are applied to a level shifter circuit 27 which replicates the collection of C[0] . . . C[n−1] as corresponding NC signals 28 suitable for driving N-FET's and corresponding PC signals 29 suitable for driving P-FET's. It will be noted that from the figure that, in the case where more than one delay element is to be driven from the digital control value 7, the collections 28 and 29 are simply routed to them, as well.

We prefer to use the FET's in complementary pairs that are also similarly sized within the pair. The use of both P- and N-FET's in a pair increases the delay range obtainable for a given number of bits in the digital delay control value 7. What happens is this. During one edge one of the FET's in a turned-on pair will cease conducting as the voltage on the capacitor 35 nears the end of its excursion (approaches within a threshold voltage of the FET's gate voltage). If this FET were in the circuit by itself, then the contribution of its corresponding control bit (via the gate voltage) would be at an end, and the length of the obtainable delay could not be increased without an additional FET (there has to be a conducting FET to keep the capacitor 35 charging [or discharging]). However, the other FET of the pair is driven by a gate voltage for which the voltage excursion on the capacitor 35 is in the opposite direction (i.e., goes away from the gate voltage and helps keep the FET on instead of tending to turn it off). The upshot is that the effective resistance of the complementary FET pair for RC time constant purposes is not constant (probably would not be anyway) because when the one FET does turn off near the end of the capacitor's excursion the other FET remains on. The role of the complementary FET's in the pair interchanges in relation to leading and trailing edges. In each case, this remaining on near the end of the excursion increases the range of available delay values for the circuit.

It will be appreciated that it is preferred that the output stages of the buffers 32 and 33 be of the active pull-up and active pull-down variety.

There are different ways the circuitry of FIG. 2 described above can be combined to form pulse delay circuits. Consider a delay stage starting with input buffer 32 and ending with output buffer 33. We may term that a complete full range delay stage. In a preferred embodiment these buffers are inverting, and the resulting complete full range delay stage can be cascaded with others of its type, as indicated by dotted line portion 42. However, such completeness may not be necessary. Let us consider the paired complementary FET's 36–41 and the output buffer 33 to be a basic delay element, as indicated by the bracket 30 in the figure. These can also be cascaded, as indicated by dotted line portion 43.

We claim:

1. A method of delaying a pulse comprising the steps of:
   (a) delaying a stream of regularly occurring reference pulses for one whole period with a cascaded series of four identical quarter period delay circuits, each of which delays its associated input pulse according to the variable resistance afforded by turning on and off selected pairs of paralleled n-channel and p-channel FETs that are in series with a grounded input capacitance in a voltage threshold circuit whose output is a pulse delayed from the associated input pulse by a quarter period;
   (b) comparing for coincidence of leading edges a pulse delayed by one whole period according to step (a) with the next undelayed pulse in the stream of reference pulses; and
   (c) adjusting, with a servo-mechanism and in response to the comparing of step (b), which respectively the same pairs of paralleled n-channel and p-channel FETs in each of the four quarter period delay circuits are turned on and turned off, the adjusting maintaining coincidence of a delayed pulse with its undelayed successor in the stream of reference pulses.

2. A method of delaying a pulse as in claim 1, further comprising the step of:
   (d) delaying by a quarter period an input pulse of unknown arbitrary time of arrival by applying it to a fifth quarter period delay circuit identical to each of the four quarter period delay circuits of step (a) and whose pairs of paralleled FETs are also turned on and off by the servo-mechanism of step (c) so as to be adjusted identically to those of step (a).

3. A pulse delay circuit comprising:
   a servo-controlled delay circuit having an input for receiving an applied stream of regularly occurring reference pulses, that delays the applied stream of regularly occurring reference pulses by one period, and having an output at which the delayed reference pulses appear, the servo controlled delay circuit comprising four cascaded quarter period delay circuits each comprising:
   a first buffer having an input for receiving a pulse to be delayed and an active output at which appears a buffered version of the pulse to be delayed;
   a second buffer having an input with shunt capacitance and having an output at which appears a delayed version of a pulse applied to the input of the first buffer;
   a plurality of complementary FET pairs coupled between the output of the first buffer and the input of the second buffer; and
   the input of the servo-controlled delay circuit being the input of the first buffer in the quarter period delay circuit that is first in the cascaded four thereof, and the output of the servo-controlled delay circuit being the output of the second buffer in the quarter period delay circuit that is fourth in the cascaded four thereof; and
   a servo circuit detecting the order of arriving edges, coupled to the applied stream of reference pulses and to the reference pulses that are delayed by one period, the servo circuit producing servo signals coupled to the four pluralities of complementary FET pairs.

4. A pulse delay circuit as in claim 3 wherein the gates of the complementary FET's in a pair are coupled to respective complementary drive signals that turn the complementary FET's in a pair on and off in unison.

5. A pulse delay circuit as in claim 4 wherein the complementary FET pairs are sized such that each pair makes a different contribution to a time constant created by the shunt capacitance and the effective resistance of FET's that are switched on.

6. A pulse delay circuit as in claim 5 wherein the complementary drive signals for the different complementary FET pairs are coded in binary and the sizing of the complementary FET pairs is binary weighted.

7. A pulse delay circuit as in claim 3 further comprising a fifth quarter period delay circuit coupled to the servo signals and whose input is coupled to a signal having an arbitrary time of arrival.

8. A pulse delay circuit comprising:
   a servo-controlled delay circuit having an input for receiving an applied stream of regularly occurring reference pulses, that delays the applied stream of regularly occurring reference pulses by one period, and having an output at which the delayed reference pulses appear, the servo controlled delay circuit comprising two cascaded half period delay circuits each comprising:
   a first buffer having an input for receiving a pulse to be delayed and an active output at which appears a buffered version of the pulse to be delayed;
   a second buffer having an input with shunt capacitance and having an active output at which appears a delayed version of a pulse applied to the input of the first buffer;
   a first plurality of complementary FET pairs coupled between the output of the first buffer and the input of the second buffer;
   a third buffer having an input with shunt capacitance and an output at which appears a further delayed version of a pulse applied to the input of the first buffer;
   a second plurality of complementary FET pairs coupled between the output of the second buffer and the input of the third buffer; and the input of the servo-controlled delay circuit being the input of the first buffer in the half period delay circuit that is first in the cascaded four thereof, and the output of the servo-controlled delay circuit being the output of the third buffer in the half period delay circuit that is second in the cascaded two thereof; and a servo circuit detecting the order of arriving edges, coupled to the applied stream of reference pulses and to the reference pulses that are delayed by one period, the servo circuit producing servo signals coupled to the four first and second pluralities of complementary FET pairs.

9. A pulse delay circuit as in claim 8 further comprising a quarter period delay circuit coupled to the servo signals and whose input is coupled to a signal having an arbitrary time of arrival, the quarter period delay circuit comprising:

a fourth buffer having an input for receiving a pulse to be delayed and an active output at which appears a buffered version of the pulse to be delayed;

a fifth buffer having an input with shunt capacitance and having an active output at which appears a delayed version of a pulse applied to the input of the fourth buffer; and a plurality of complementary FET pairs responsive to the servo signals and coupled between the output of the fourth buffer and the input of the fifth buffer.

* * * * *